United States Patent
Ramani

[11] Patent Number: 6,084,282
[45] Date of Patent: *Jul. 4, 2000

[54] LOW-STRESS AND LOW-SENSITIVITY METAL FILM

[75] Inventor: Swayambu Ramani, San Jose, Calif.

[73] Assignee: Candescent Technologies Corporation, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/839,757

[22] Filed: Apr. 1, 1997

[51] Int. Cl.$^7$ ........................................... H01L 29/78
[52] U.S. Cl. .............................. 257/443; 257/444
[58] Field of Search ............................ 257/443, 444, 257/53

[56] References Cited

U.S. PATENT DOCUMENTS

| | | | |
|---|---|---|---|
| 4,702,967 | 10/1987 | Black et al. | 428/620 |
| 5,231,306 | 7/1993 | Meikle et al. | 257/751 |
| 5,589,712 | 12/1996 | Kawashima et al. | 257/750 |
| 5,670,823 | 9/1997 | Kruger et al. | 257/751 |
| 5,747,879 | 5/1998 | Rastogi et al. | 257/751 |

*Primary Examiner*—Stephen D. Meier
*Attorney, Agent, or Firm*—Wagner, Murabito & Hao LLP

[57] ABSTRACT

A thin-film coupled to a substrate includes a first layer and a second layer. Both layers are made of the same material, which is either a transition or a refractory metal. The first layer is doped by nitrogen and the second layer is not. The thin-film has lower stress level than a film made of the same material and having similar thickness as the thin-film, but without doping the film by nitrogen. Also, the thin-film has a lower sheet resistance than a film made of the same material, having similar thickness as the thin-film, and with similar atom percentage of nitrogen as the first layer. In one embodiment, the thin-film is used in a flat panel display.

4 Claims, 5 Drawing Sheets

| Power 150 | Pressure 152 | Air Flow 154 | N Flow 156 | Scan Speed 158 | Thickness 160 | Thick U 162 | Sheet Res 164 | Stress 166 |
|---|---|---|---|---|---|---|---|---|
| 1.5 | 10 | 225 | 9 | 170 | 1997 | 2 | 2.5 | 0.87 |
| 3 | 15 | 150 | 6 | 170 | 4002 | 1.5 | 1.25 | 0.77 |
| 3 | 15 | 225 | 4.5 | 170 | 4771 | 1.1 | 1.25 | 0.50 |

FIG. 2

LOW-STRESS AND LOW-SENSITIVITY METAL FILM

BACKGROUND OF THE INVENTION

The present invention relates generally to transition or refractory metallic thin-films, and more particularly to a low-stress and low-resistivity transition or refractory metal thin-film that can be used in a large format flat-panel display.

Thin-film adhesion onto substrates is a challenging problem. After deposition onto substrates, many types of thin-films do not stick firmly onto the substrate. They fail the tape test: Stick a scotch tape onto the substrate with thin-films, and remove the tape; thin-films with poor adhesion leave with the tape.

One reason causing the adhesion problem is that the films are stressed. Their natural state is to be curved with respect to the flat substrate. Thus, they want to be lifted off from the substrate. Typically, 1.5 to 2.0 E10 dynes/cm2 tensile stress for a 2000 Å film is a stressed film. If the tensile stress is below 1 E10 dynes/cm2, that film is considered relatively low-stressed.

The stress problems are intensified in diverse film stacks. For example, in a flat panel display, there can be thousands of row and column buses. In one embodiment, the row electrodes are made of chromium films, which are covered by a resistive film and a dielectric film; on top of the dielectric film, there are the chromium column buses. The column buses have to conform to the profile of other underlying films, and there is a tendency for the chromium buses to break due to stress, especially at the dielectric/resistor interface. As the size of the display increases, the yield goes down. In fact, the yield of a prior art large format display with a 320 mm by 340 mm panel has been reduced to 0% due to stress-breakage of the buses.

One way to reduce stress in a thin-film is to dope the thin-film with nitrogen, such as introducing nitrogen into a chromium film. For example, a 5% nitrogen-argongas mixture in an in-line sputtering system reduces the stress in a chromium film from 1.5 E10 to 4.0 E9 dynes/cm2. However, such benefits are at the expense of an increase in the film's sheet resistance—from 2 to 8 ohms/sq., for example.

Many applications using thin-films require the films to have low sheet resistance. This is because a low resistive film consumes less power, generates less heat and reduces signal delay due to RC time constant.

It should be obvious from the foregoing that there is a dilemma. Nitrogen doping has been known to reduce stress; however, nitrogen significantly increases the film's sheet resistance, which is detrimental to many applications. Thus, there is a need to have thin-films with two mutually exclusive characteristics—low in stress and low in sheet resistance.

SUMMARY OF THE INVENTION

The present invention provides thin-films that are both low in stress and low in sheet resistance. Based on the invention, the thin-film generated includes two layers: one layer for reducing stress and the other layer for reducing sheet resistance. By combining the strengths of both layers, the present invention has created low stress and low sheet resistance thin-films.

In one embodiment, the invention includes a substrate with a thin-film that has a first layer and a second layer. The first layer is made of either a transition or a refractory metal. The layer is doped by nitrogen to reduce its stress level. The second layer is made of the same material as the first layer, but it is not doped by nitrogen. The thin-film has lower stress level than a film made of the same material and having similar thickness as the thin-film, but not doped by nitrogen. Also, the thin-film has a lower sheet resistance than a film made of the same material, having similar thickness as the thin-film, and with similar atom percentage of nitrogen as the first layer.

In another embodiment, the material of the first and the second layers is selected from the group of (Groups IVB, VB and VIB between Periods 4 to 6, and Groups VIIB and VIII in Period 4) in the Periodic Table.

In yet another embodiment, the material is chromium, and a 2000 Å thick thin-film generated has a tensile stress of less than about 1 E10 dynes/cm2 and a sheet resistance of less than about 2.5 ohms/sq. The sheet resistance can be further reduced to 2 ohms/sq. with the stress remaining substantially the same, by baking the thin-film, such as at 450 C for 1 hour. The stress of such a two-layer thin-film is at least 50% lower than the prior art film of the same material and thickness, while maintaining the same sheet resistance of about 2 ohms/sq.

The invention can be applied to many applications. In one embodiment, a flat panel display uses the invention for its buses to bias its electron sources. The display includes numerous row buses on a substrate, a resistive film almost overlaying all of the row buses, and an inter-metal dielectric film on the resistive film. On top of the dielectric film there are numerous column buses, which are generated by the thin-films. In one embodiment, the display is a large format flat panel display with a 320 mm by 340 mm panel; none of the column buses breaks due to stress. In other words, in the present invention, the reduction in yield due to stress is 0%.

Other aspects and advantages of the present invention will become apparent from the following detailed description, which, when taken in conjunction with the accompanying drawings, illustrates by way of example the principles of the invention.

BRIEF DESCRIPTION OF THE DRAWINGS

FIG. 2 shows a table of experimental values illustrating the present invention.

Figure 1:
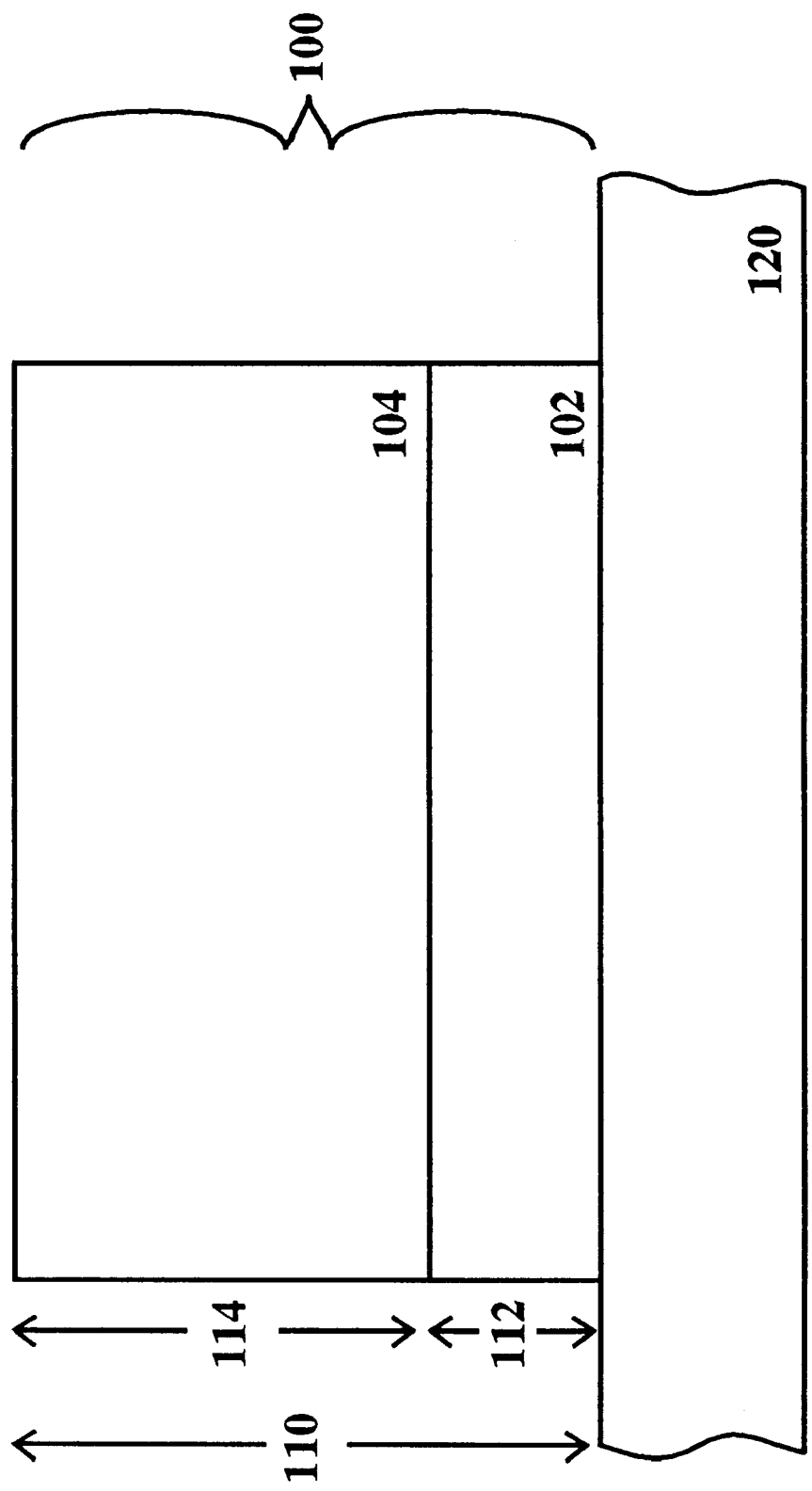
FIG. 1 shows one embodiment of the present invention.

Same numerals in FIGS. 1–3 are assigned to similar elements in all of the figures. Embodiments of the invention are discussed below with reference to FIGS. 1–3. However, those skilled in the art will readily appreciate that the detailed description given herein with respect to these figures is for explanatory purposes as the invention extends beyond these limited embodiments.

DETAILED DESCRIPTION OF THE INVENTION

FIG. 1 shows one embodiment 100 of the present invention. It is a thin-film that includes two layers, 102 and 104. Both layers are made of the same material, but one layer is doped by nitrogen, and the other layer is not.

The first layer 102 is coupled to a substrate 120. There might be additional films between the first layer 102 and the substrate 120. The second layer 104 is on top of the first layer 102. The first layer 102 is doped by nitrogen, but the second layer 104 is not. The thin-film 100 has a thin-film thickness 110 that is composed of a first thickness 112 of the first layer 102 and a second thickness 114 of the second layer 104.

In one invented process, the thin-film is generated by an in-line sputtering system. A specific power is applied to the sputtering target, while ionized argon flows through the system at a specific pressure, volume and speed. The target is sputtered as the pallet that is carrying the thin-film substrate moves across the target at a certain scan speed.

Based on the system, the first layer is deposited, while nitrogen at a specific volume and speed also flows through the system. Without breaking vacuum, the second layer is sequentially deposited, but without the nitrogen flowing.

FIG. 2 shows some experimental results of the thin-film made of chromium generated by the Kurdex Model V3000 in-line sputtering system, which is used to illustrate the present invention. Note that other sputtering systems are equally applicable. As an example based on the Kurdex system, (1) with the specific power 150 of the sputtering target at 1.5 Kwatts, (2) the specific pressure 152 of argon ions at 10 mTorr, (3) the volume and flow speed of argon 154 at 225 standard cubic centimeter/minute (SCCM), (4) the volume and flow speed 156 of nitrogen at 9 SCCM, (5) the scan speed 158 of the target at 170 millimeter/minute, the thin-film 100 fabricated has (1) a thickness 160 of 1997 Å, with about 50% of the film thickness being the nitrogen-doped first layer and the remaining part of the film being the undoped second layer, (2) a thickness uniformity 162 of 2% across the film, (3) a sheet resistance 164 of 2.5 ohms/sq., and (4) a tensile stress 166 of 0.87 E10 dynes/cm2.

The sheet resistance 164 goes down to 2 ohms/sq., with the stress remaining substantially the same, if the thin-film is baked at 450 C for 1 hour, excluding the time required to ramp-up to, and to ramp-down from the temperature.

A prior art 2000 Å thick chromium film that is not doped by nitrogen has a stress level of about 1.5 to 2.0 E10 dynes/cm2. Thus, the stress of the two-layer thin-film is at least 50% lower than the prior art film, while maintaining the same sheet resistance of about 2 ohms/sq.

In another example, (1) with the specific power 150 of the sputtering target at 3 Kwatts, (2) the specific pressure 152 of argon ions at 15 mTorr, (3) the volume, and flow speed of argon 154 at 225 standard cubic centimeter/minute (SCCM), (4) the volume and flow speed 156 of nitrogen at 4.5 SCCM, (5) the scan speed 158 of the target at 170 millimeter/minute, the thin-film 100 fabricated has (1) a thickness 160 of 4771 Å, with about 50% of the film thickness being the nitrogen-doped first layer and the remaining part of the film being the undoped second layer, (2) a thickness uniformity 162 of 1.1% across the film, (3) a sheet resistance 164 of 1.25 ohms/sq., and (4) a tensile stress 166 of 0.5 E10 dynes/cm2.

In this example, the atom percentage of nitrogen in the first layer is measured to be about 3%.

As shown by the experimental data in FIG. 2, both the stress and the resistivity are low even for a thin-film that is 4000 Å thick. Note that the first thickness 112 is substantially equal to the second thickness 114 in the thin-films shown in FIG. 2; or the ratio of the thickness of the two layers is approximately equal to 1. Parameters shown in FIG. 2 only serve as examples. Other values are also applicable.

As shown in the examples in FIG. 2, the thin-film has lower stress level than a film made of the same material and having similar thickness as the thin-film, but without doping it by nitrogen. Also, the thin-film has a lower sheet resistance than a film made of the same material, having similar thickness as the thin-film, and with similar atom percentage of nitrogen as the first layer.

In many applications, it is beneficial to ensure the thin-film to be as thin as possible while still maintaining a low sheet resistance. This is because the thinner the film is, the better step coverage it has for subsequent films. As shown from the data, if one desires to have a chromium thin-film with a sheet resistance of 2 ohms/sq. and having low stress, the thickness of the film only has to be 2000 Å.

As described above, the atom percentage of nitrogen in the first layer is quite low—in one example, it is about 3%. Other atom percentage of nitrogen is also applicable so as to set the film stress and resistivity to different desired values. This can be done, for example, by changing the SCCM of nitrogen flowing through the system.

The present invention allows tailoring film stress and film resistivity for a given application. Not only can the atom percentage be changed, the ratio of the thickness of the first and the second layers can also be changed to balance the stress of the thin-film relative to its sheet resistance. For example, relative to a thin-film whose thickness ratio between the first and the second layer is equal to 1, the first layer 102 can be thicker than the second layer 104; this will translate to a thin-film with lower stress, but with higher sheet resistance.

Another benefit of the present invention is that the thin-film generated, whether it is baked at 450 C for 1 hour or not, passes the tape test. The thin-film has very good adhesion characteristic. Moreover, by baking the thin-film shown in FIG. 2, one can further reduce its sheet resistance, without affecting its stress level.

Figure 3A:
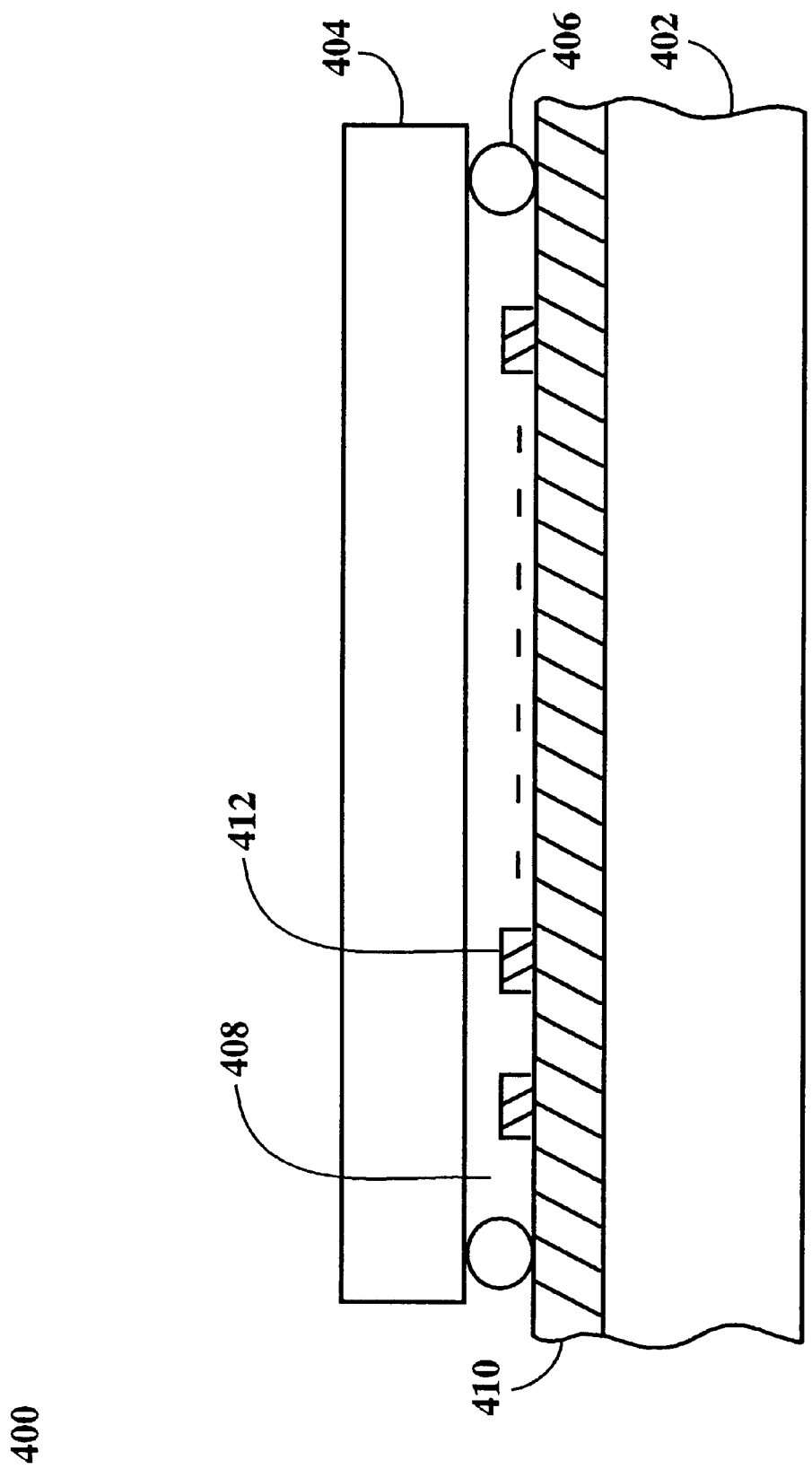
FIGS. 3A–C show different perspectives of a flat panel display using the present invention.
Figure 3B:
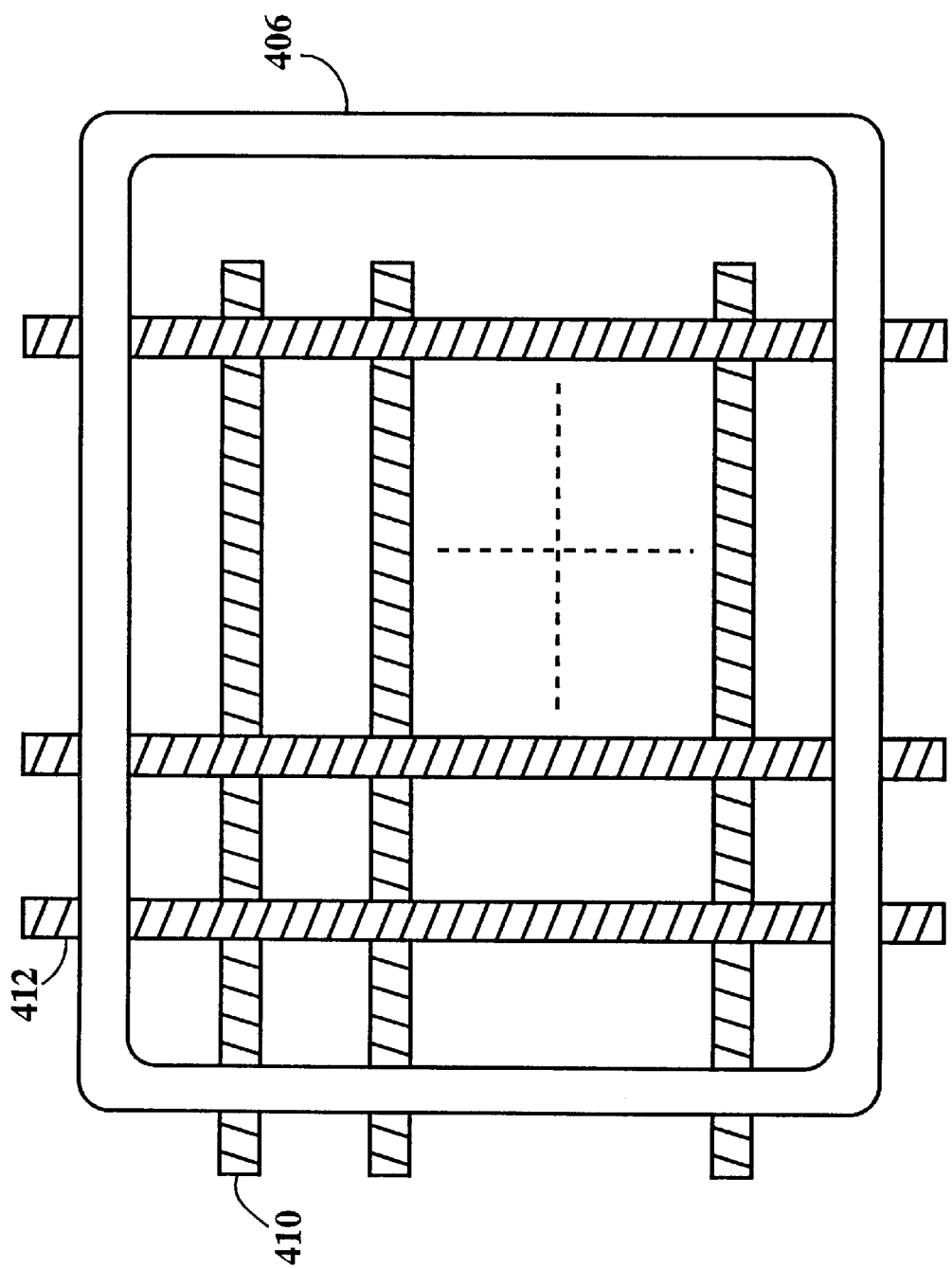
Figure 3C:
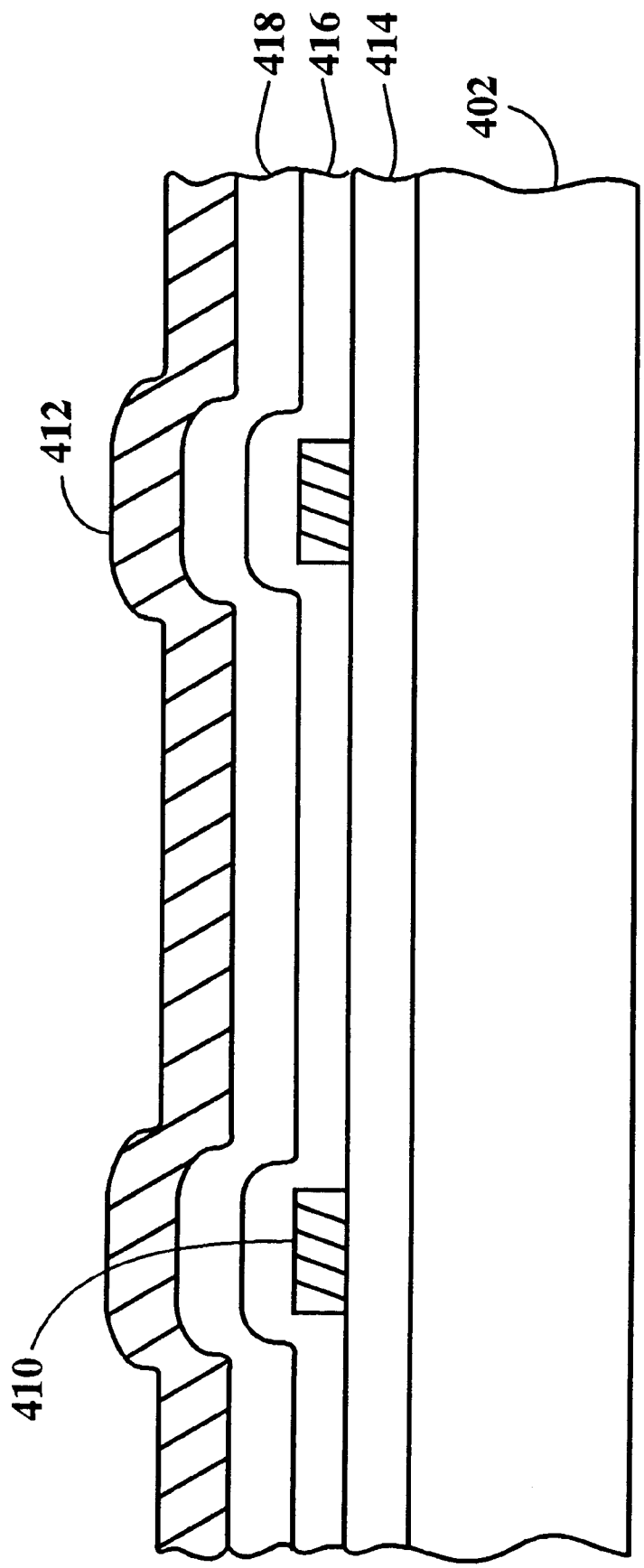

FIGS. 3A–C show different perspectives of a flat panel display 400 using the present invention. Many elements have been omitted, and different components in the figures are not drawn to scale so as to highlight a number of the inventive aspects. FIG. 3A illustrates a cross-section of the display 400, FIG. 3B illustrates the top view of buses in the display, and FIG. 3C shows a cross-section of a diverse film stack in the display.

As shown in FIG. 3A, the display 400 includes a substrate 402, a faceplate 404 and a frit glass vacuum sealing ring 406 between the substrate 402 and the faceplate 404. The ring 406 vacuum-seals a cavity 408 between the substrate 402 and the faceplate 404. In one embodiment, the substrate 402 is made of glass, the faceplate 404 includes fluorescent materials on the surface facing the cavity 408, and the ring 406 is made of frit glass.

The display 400 includes a number of row buses 410 and column buses 412. The row buses are coupled to one surface of the substrate 402. They are better illustrated in FIG. 3B. Typically, they are periodically positioned, and are substantially parallel to each other. The column buses 412 are substantially orthogonal to the row buses.

As shown in FIGS. 3A–B, both the column and the row buses extend out of the ring 406 for biasing purposes. Thus both buses have to be made of a material that is able to withstand heat because in forming the seal, the frit glass has to be melted. With the frit glass being on top of the buses, the buses, such as their conductivity, should not be adversely affected by the process. In one embodiment, the column and the row buses are made of chromium.

FIG. 3C shows a cross-section of a diverse film stack of row and column buses of the display 400. The diverse film stack includes a silicon dioxide barrier layer 414 on the substrate 402. The row buses 410 are on top of the barrier layer 414. Over the row buses, there is a resistive film 416, which can be made of silicon carbide. Covering the resistive film 416 is an inter-metal dielectric film 418. Then comes the column buses 412.

In one embodiment, the column buses are made of the thin-film 100. In another embodiment, both the column and the row buses are made of the thin-film 100. As discussed above, the present invention can tailor the thin-film stress and resistivity for a given application. For example, the present invention has been used to generate a 3000 Å thick thin-film at 4 to 5 ohms/sq. with a stress level that is less than 4 E9 dynes/cm2; the first layer is about 2000 Å thick, the second layer is about 1000 Å thick and the atom percentage of nitrogen in the first layer is about 3%. The thin-film generated can be used as the electrodes in the faceplate of the flat panel display. In yet another embodiment, the thin-film 100 is used as gate electrodes for field emitter sources of a field-emitter flat panel display.

Chromium has been used as one example for the material used in the first and the second layer. Other types of transition and refractory metal can also be used. In one embodiment, the material is selected from the set of (Groups IVB, VB and VIB between Periods 4 to 6, and Groups VIIB and VIII in Period 4) in the Periodic Table; and they include Titanium, Zirconium, Hafnium, Vanadium, Niobium, Tantalum, Molybdenum, Tungsten, Manganese, Iron, Cobalt, and Nickel.

The thickness of the thin-film is not limited to those shown in FIG. 2 for the present invention. Other thickness can be used, for example, the thickness can range from approximately 400 angstroms to 1 micron or more.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

I claim:

1. In a flat panel display, a multi-layer thin film structure coupled to a backplate of said flat panel display, the multi-layer thin film structure adapted to be used as a bus material for said flat panel display, said multi-layer thin film structure, comprising:

a first layer of a thin-film coupled to the substrate, said first layer being made of a metal selected from the group of transition and refractory metals, and said first layer being doped by nitrogen to reduce its stress level; and a second layer of said thin-film, said second layer disposed on said first layer, said second layer being made of the same material as said first layer, but said second layer not being doped by nitrogen;

such that:

said thin-film has lower stress level than a film made of the same material and having similar thickness as said thin-film, but without doping said film by nitrogen; and said thin-film has a lower sheet resistance than said film made of the same material, having similar thickness as said thin-film, and with similar atom percentage of nitrogen as said first layer, said thin-film adapted to be used in a flat panel display as a bus material for said flat panel display.

2. The multi-layer thin film structure of the flat panel display as recited in claim 1 wherein said metal is selected from the set of (Group IVB, VB and VIB between Periods 4 to 6, and Group VIIB and VIII in Period 4) in the Periodic Table.

3. The multi-layer thin film structure of the flat panel display as recited in claim 1 wherein said metal is chromium.

4. The multi-layer thin film structure of the flat panel display as recited in claim 3 wherein:

said stress level of said thin-film is below 1 E10 dynes/cm2; and said sheet resistance of said thin-film is below 2.5 ohms/Sq.

\* \* \* \* \*

UNITED STATES PATENT AND TRADEMARK OFFICE
CERTIFICATE OF CORRECTION

PATENT NO. : 6,084,282
DATED : July 4, 2000
INVENTOR(S) : Swayambu Ramani

It is certified that error appears in the above-identified patent and that said Letters Patent is hereby corrected as shown below:

<u>Title page</u>,
Item [54], Title, change "LOW-STRESS AND LOW-SENSITIVITY METAL FILM" to -- LOW-STRESS AND LOW-RESISTIVITY METAL FILM --.

Signed and Sealed this

Sixth Day of September, 2005

JON W. DUDAS
*Director of the United States Patent and Trademark Office*